(12) United States Patent
Sasaki et al.

(10) Patent No.: US 9,019,032 B2
(45) Date of Patent: Apr. 28, 2015

(54) EBG STRUCTURE, SEMICONDUCTOR DEVICE, AND PRINTED CIRCUIT BOARD

(71) Applicants: Tadahiro Sasaki, Tokyo (JP); Kazuhiko Itaya, Kanagawa (JP); Hiroshi Yamada, Kanagawa (JP)

(72) Inventors: Tadahiro Sasaki, Tokyo (JP); Kazuhiko Itaya, Kanagawa (JP); Hiroshi Yamada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 240 days.

(21) Appl. No.: 13/677,840

(22) Filed: Nov. 15, 2012

(65) Prior Publication Data

US 2013/0256009 A1  Oct. 3, 2013

(30) Foreign Application Priority Data

Mar. 29, 2012 (JP) ................. 2012-075519

(51) Int. Cl.
| | | |
|---|---|---|
| H01P 5/08 | (2006.01) | |
| H05K 1/16 | (2006.01) | |
| H05K 1/09 | (2006.01) | |
| H05K 1/02 | (2006.01) | |
| H05K 1/18 | (2006.01) | |

(52) U.S. Cl.
CPC .............. *H05K 1/162* (2013.01); *H05K 1/09* (2013.01); *H05K 1/0236* (2013.01); *H05K 1/185* (2013.01); *H05K 2201/0715* (2013.01); *H01L 2924/0002* (2013.01); *H01L 2224/16225* (2013.01)

(58) Field of Classification Search
USPC .......................................................... 333/12
See application file for complete search history.

(56) References Cited

U.S. PATENT DOCUMENTS

| | | | |
|---|---|---|---|
| 7,944,320 B2 * | 5/2011 | Han et al. ................ | 333/12 |
| 8,076,998 B2 | 12/2011 | Bong et al. | |
| 8,159,413 B2 | 4/2012 | Park et al. | |

FOREIGN PATENT DOCUMENTS

| | | |
|---|---|---|
| JP | 2009-218966 | 9/2009 |
| JP | 2010-16554 | 1/2010 |

OTHER PUBLICATIONS

U.S. Appl. No. 13/951,894, filed Jul. 26, 2013, Sasaki, et al.
U.S. Appl. No. 13/951,875, filed Jul. 26, 2013, Sasaki, et al.
U.S. Appl. No. 14/183,720, filed Feb. 19, 2014, Sasaki, et al.
Notification of Reason(s) for Refusal issued Jul. 8, 2014 in Japanese Patent Application No. 2012-075519 (with English translation).
U.S. Appl. No. 14/332,781, filed Jul. 16, 2014, Sasaki, et al.
U.S. Appl. No. 14/332,542, filed Jul. 16, 2014, Sasaki, et al.

* cited by examiner

*Primary Examiner* — Robert Pascal
*Assistant Examiner* — Kimberly Glenn
(74) *Attorney, Agent, or Firm* — Oblon, McClelland, Maier & Neustadt, L.L.P.

(57) ABSTRACT

An EBG structure according to an embodiment includes an electrode unit made of a first conductor and provided with a space, a patch unit provided approximately parallel to the electrode unit and made of a second conductor, an insulating layer provided between the electrode unit and the patch unit, a first via provided between the patch unit and the electrode unit in the insulating layer and connected to the patch unit and the electrode unit, and a second via provided between the patch unit and the space in the insulating layer, connected to the patch unit, and not connected to the electrode unit.

12 Claims, 4 Drawing Sheets

EBG STRUCTURE, SEMICONDUCTOR DEVICE, AND PRINTED CIRCUIT BOARD

CROSS-REFERENCE TO RELATED APPLICATION

This application is based upon and claims the benefit of priority from Japanese Patent Application No. 2012-075519, filed on Mar. 29, 2012, the entire contents of which are incorporated herein by reference.

FIELD

Embodiments described herein relate generally to an EBG structure, a semiconductor device, and a printed circuit board.

BACKGROUND

A semiconductor device such as a conventional board mounting thereon a digital, analog, and RF mixing circuit, an SOC (system on chip), or a pseudo SOC has a problem in which mutual electromagnetic field interference between elements and noises propagating to a GND (ground) line and a power line cause malfunction. To avoid this problem, a large space needs to be taken between the elements. This has been caused a problem of difficulty in reducing a chip area and an assembly area.

As an exemplary means for reducing this space, a filter that prevents noises in a harmful frequency range to circuit operations propagating to the GND line or the power line is used, for example. In this case, a filter that lowers a noise level in a stopband range, which is a limited frequency range, is used. The filter is formed with use of an inductor chip and a capacitor chip, for example. This inevitably leads to an increase in the number of assembling components.

Under such circumstances, an EBG (Electromagnetic Band Gap) structure in a dielectric board is proposed since it exerts a greater size-reduction effect than forming a filter by chip components. However, the EBG structure still has a problem of not being able to reduce the size since the EBG structure is enlarged in a case where the stopband range is set to a low frequency range (6 GHz or lower). The EBG structure also has a problem of difficulty in securing a wide stopband range.

To cope with this, efforts to improve the EBG structure are being made in order to reduce the size of the EBG structure.

DETAILED DESCRIPTION

An EBG structure according to an embodiment includes an electrode unit made of a first conductor and provided with a space, a patch unit provided approximately parallel to the electrode unit and made of a second conductor, an insulating layer provided between the electrode unit and the patch unit, a first via provided between the patch unit and the electrode unit in the insulating layer and connected to the patch unit and the electrode unit, and a second via provided between the patch unit and the space in the insulating layer, connected to the patch unit, and not connected to the electrode unit.

In the present specification, a concept of a semiconductor device covers not only a semiconductor chip or a semiconductor package in which a semiconductor chip is sealed but also a semiconductor product in which, for example, a plurality of semiconductor chips are attached with a resin and are connected to each other by a wiring layer, that is, a so-to-speak pseudo SOC (System On Chip), a product in which a plurality of semiconductor chips are mounted on a printed circuit board, and the like.

First Embodiment

An EBG structure according to the present embodiment includes an electrode unit made of a first conductor and provided with a space (or a cutout), a patch unit provided approximately parallel to the electrode unit and made of a second conductor, an insulating layer provided between the electrode unit and the patch unit, a first via provided between the patch unit and the electrode unit in the insulating layer and connected to the patch unit and the electrode unit, and a second via provided between the patch unit and the space in the insulating layer, connected to the patch unit, and not connected to the electrode unit.

Also, a semiconductor device according to the present embodiment is a semiconductor product including the above EBG structure in which a plurality of semiconductor chips are attached with a resin and are connected to each other by a wiring layer, that is, a so-to-speak pseudo SOC.

Figure 1:
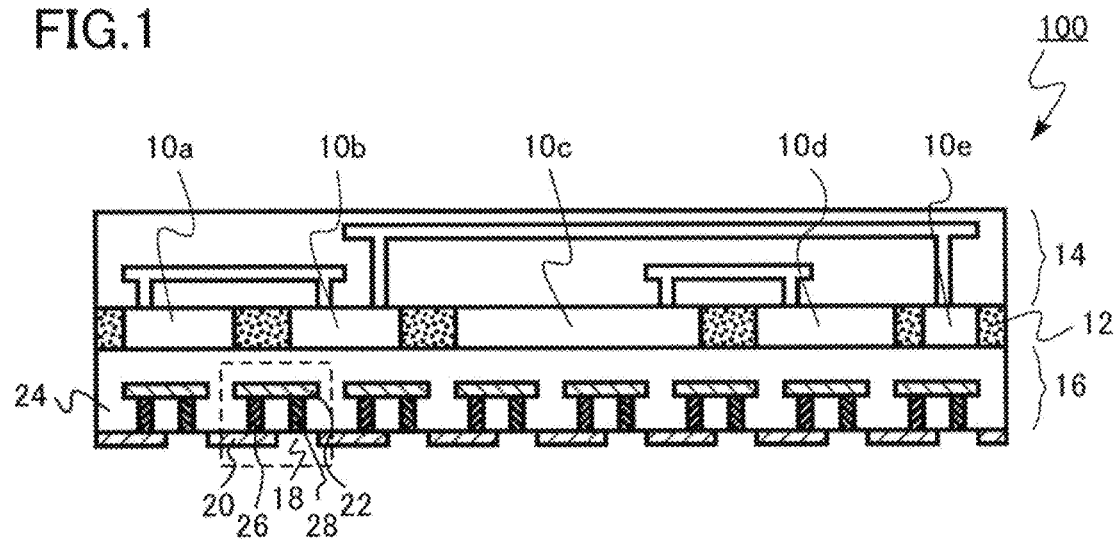
FIG. 1 is a schematic cross-sectional view of a semiconductor device according to a first embodiment.

FIG. 1 is a schematic cross-sectional view of a semiconductor device according to the present embodiment. A pseudo SOC 100 has a plurality of semiconductor chips 10a to 10e. The semiconductor chips 10a to 10e are attached with a resin 12. The semiconductor chips 10a to 10e are electrically connected to each other by a multilayered wiring layer 14, for example.

Figure 2:
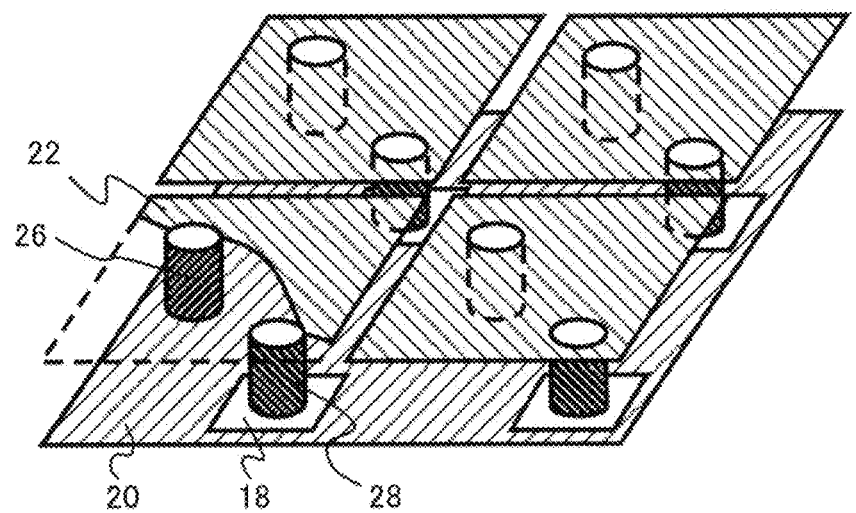
FIG. 2 is a schematic perspective view of an EBG structure according to the first embodiment.

The lower portion of the semiconductor chips 10a to 10e of the pseudo SOC 100 is provided with an EBG structure 16. An area surrounded by a dotted line in FIG. 1 is one unit of the EBG structure 16. The units are regularly arranged. FIG. 2 is a schematic perspective view of the EBG structure according to the present embodiment showing four units.

The EBG structure 16 has an electrode unit 20 provided with a space (or a cutout) 18 and a patch unit 22 provided approximately parallel to the electrode unit 20. The EBG structure 16 also has an insulating layer 24 provided between the electrode unit 20 and the patch unit 22. The EBG structure 16 further has a first via 26 and a second via 28.

The electrode unit 20 is a ground line, for example. A first conductor is a metal such as aluminum (Al) or gold (Au), for example. The electrode unit 20 is patterned to provide the space 18 at which the first conductor does not exist. The shape of the space 18 is not particularly limited and may be a rectangle, a circle, or another shape.

The patch unit 22 is made of a second conductor. The second conductor is a metal such as aluminum (Al) or gold (Au), for example. The shape of the patch unit 22 is not particularly limited and may be a rectangle, a circle, or another shape.

The size of the patch unit 22 is optimized to obtain a desired stopband range. The size of the patch unit 22 is preferably 10 mm square or less from a viewpoint of reducing the size of the semiconductor device.

The insulating layer 24 is an organic resin, for example.

The first via 26 and the second via 28 are respectively made of conductors. Conductors used are not particularly limited and may be metals, semiconductors, or conductive resins.

The first via 26 is provided between the patch unit 22 and the electrode unit 20 in the insulating layer 24 and connected to the patch unit 22 and the electrode unit 20. On the other hand, the second via 28 is provided between the patch unit 22 and the space 18 in the insulating layer 24, connected to the patch unit 22, and not connected to the electrode unit 20. The electrode unit 20 directly below the second via 28 is provided with the space 18.

Next, effects of the EBG structure according to the present embodiment will be described. An electromagnetic analysis of the three-dimensional structure according to the present embodiment was performed by a simulation.

Figure 3:
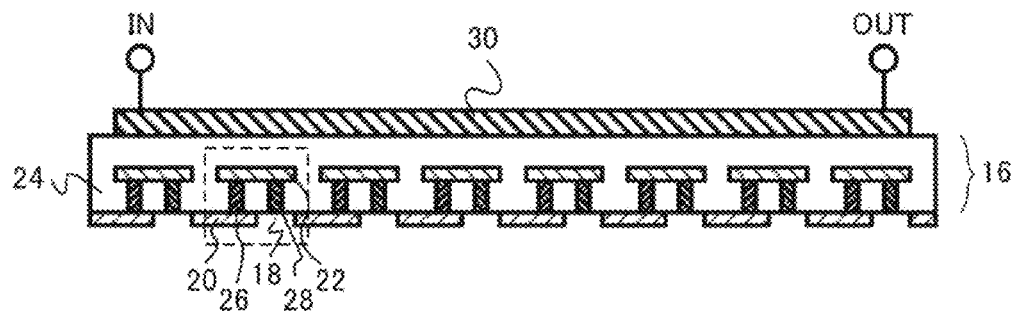
FIG. 3 is a schematic cross-sectional view of an EBG structure subjected to a simulation.

FIG. 3 is a schematic cross-sectional view of an EBG structure subjected to a simulation. In the EBG structure 16, the patch unit 22 was a square, 1 mm on a side (1 mm square), each of the first and second vias 26 and 28 had a diameter of 200 µm and a height of 200 µm, the space 18 was 500 µm square, and a dielectric constant of the insulating layer 24 was set to 4.47.

On the upper portion of the EBG structure 16 was provided via the insulating layer 24 a wire 30 having on both ends an input terminal (IN) and an output terminal (OUT). An S parameter $S_{21}$, which was a signal propagating between the input terminal and the output terminal, was simulated.

Figure 4:
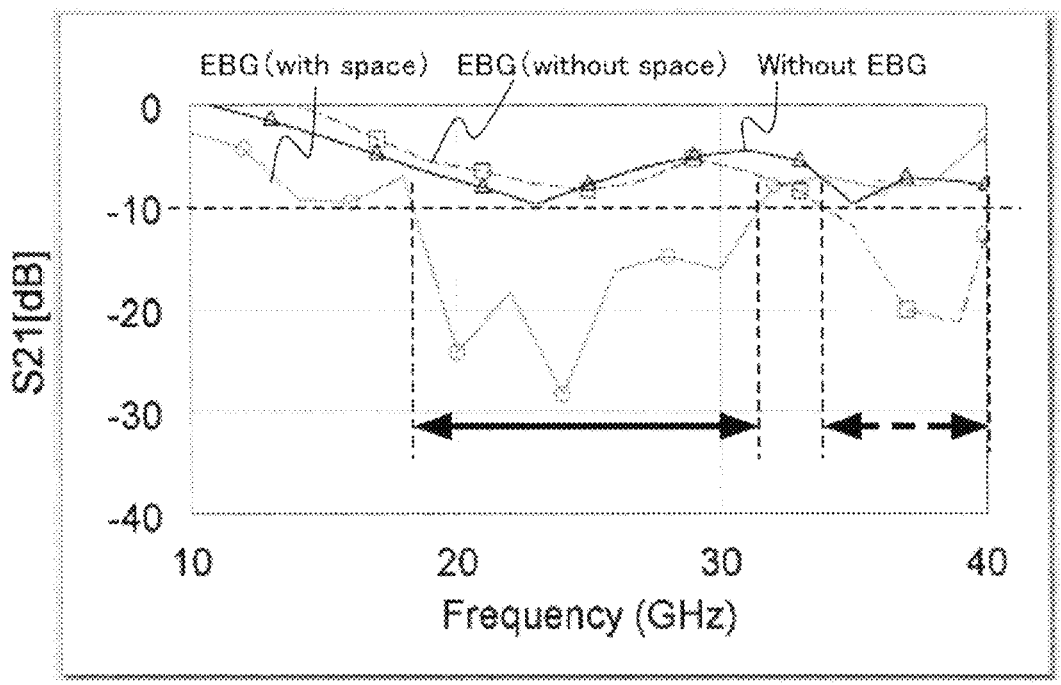
FIG. 4 illustrates a simulation result of an S parameter.

FIG. 4 illustrates a simulation result of the S parameter. For comparison, simulations in a case where no space 18 existed and in a case where no EBG structure existed in the structure in FIG. 3 were performed as well.

In a case of the EBG with no space, a stopband range in which $S_{21}$ can secure −10 dB isolation is a 34 GHz to 40 GHz range shown with a dotted arrow in the graph. On the other hand, in a case of the present embodiment with the space, the stopband range is an 18 GHz to 32 GHz range shown with a solid arrow in the graph. In this manner, providing the space can drastically lower and widen the stopband range.

In general, in order to lower the frequency range of the stopband range, the area of the patch unit needs to be enlarged. According to the present embodiment, even in a case where the area of the patch unit remains the same, the frequency range of the stopband range can be drastically lowered by providing the electrode unit with the space. Alternatively, the same frequency range of the stopband range can be achieved with the patch unit having a small area. Accordingly, by providing this EBG structure, a high-performance and small-sized pseudo SOC that restricts malfunction caused by electromagnetic field interference between elements and noises can be obtained.

Also, a high-performance RBG structure is achieved by a simple structure. Accordingly, it is possible to obtain a high-yield pseudo SOC that does not require a significant increase in the number of processes and strict process accuracy and that restricts production cost.

Meanwhile, the second via 28 preferably reaches the space 18 at the end portion on the side of the space 18 from a viewpoint of lowering and widening the frequency range of the stopband range. In other words, a space-side end portion of the second via 28 preferably reaches the space 18.

Second Embodiment

A semiconductor device according to the present embodiment differs from the first embodiment in that the EBG structure is provided between the semiconductor chips 10a to 10e and a lower electrode. Description of duplicate contents with those of the first embodiment is omitted.

Figure 5:
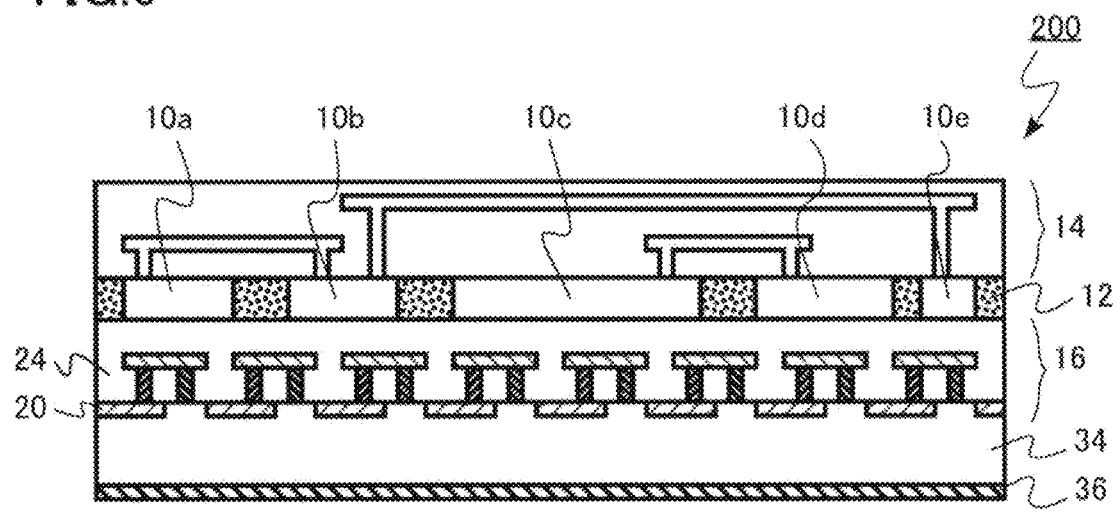
FIG. 5 is a schematic cross-sectional view of a semiconductor device according to a second embodiment.

FIG. 5 is a schematic cross-sectional view of a semiconductor device according to the present embodiment. A pseudo SOC 200 is provided with a lower electrode 36 via the insulating layer 34 on the lower portion of the EBG structure 16.

In the pseudo SOC 200, the electrode unit 20 is a power line, and the lower electrode 36 is a ground line, for example. In a case where the electrode unit 20 is a power line, it is possible to prevent malfunction caused by noises or the like resulting from the power line.

Third Embodiment

A semiconductor device according to the present embodiment differs from the first embodiment in that the EBG structure is provided in a semiconductor chip such as an SOC with use of the multilayered wiring layer 14, for example. Description of duplicate contents with those of the first embodiment is omitted.

Figure 6:
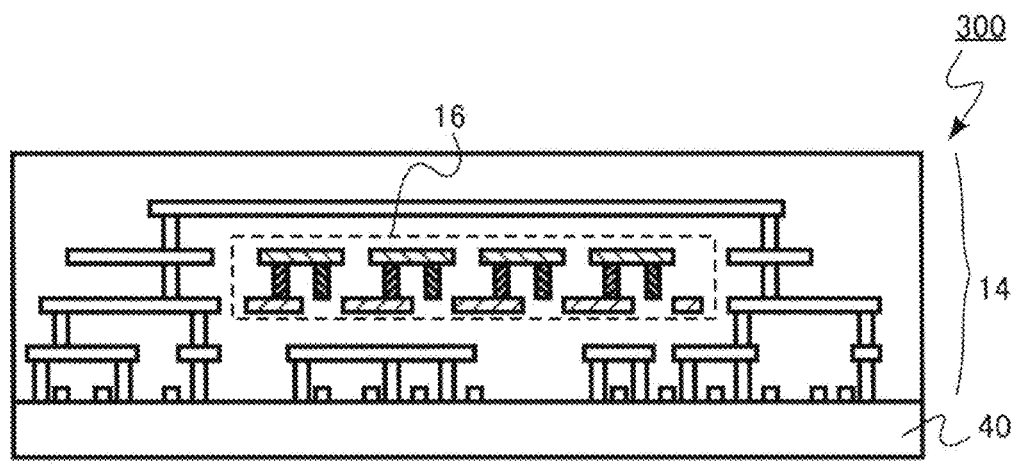
FIG. 6 is a schematic cross-sectional view of a semiconductor device according to a third embodiment.

FIG. 6 is a schematic cross-sectional view of a semiconductor device according to the present embodiment. In a semiconductor device 300, elements such as a transistor and a diode are formed on a silicon substrate 40, for example. The respective elements are connected to each other by the multilayered wiring layer 14.

In the present embodiment, the EBG structure 16 described in the first embodiment is formed with use of partial wires and vias of the multilayered wiring layer 14.

According to the present embodiment, the EBG structure 16 can be formed without adding processes in a production process of a semiconductor chip. Accordingly, it is possible to obtain a high-performance and small-sized semiconductor chip without increasing production cost.

Fourth Embodiment

A semiconductor device according to the present embodiment is a product in which a plurality of semiconductor chips or the like are mounted on a printed circuit board such as a board mounting thereon a digital, analog, and RF mixing circuit, for example. The semiconductor device differs from the first embodiment in that the EBG structure is provided in the printed circuit board. Description of duplicate contents with those of the first embodiment is omitted.

Figure 7:
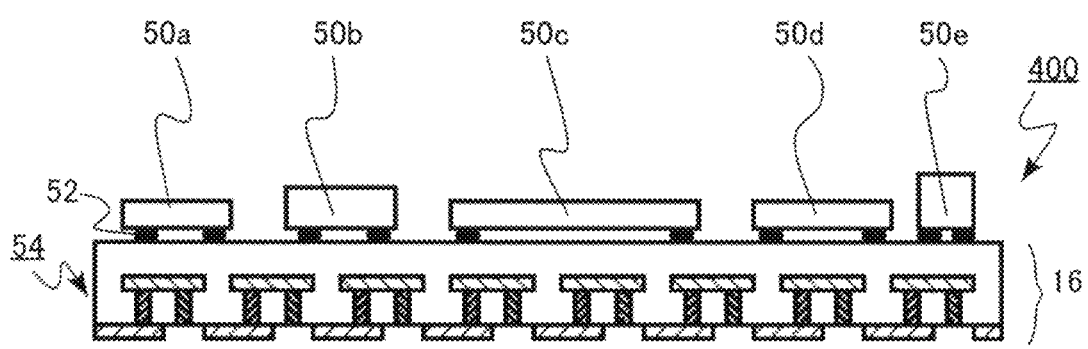
FIG. 7 is a schematic cross-sectional view of a semiconductor device according to a fourth embodiment.

FIG. 7 is a schematic cross-sectional view of a semiconductor device according to the present embodiment. In a semiconductor device 400, a plurality of semiconductor chips 50a to 50e are mounted by bump electrodes 52 on a printed circuit board 54, for example. For example, the semiconductor chips 50a to 50e are semiconductor chips selected from digital chips, analog chips, RF chips, diodes, and the like.

The EBG structure 16 described in the first embodiment is formed in the printed circuit board 54.

According to the present embodiment, it is possible to obtain a high-performance and small-sized semiconductor chip.

While certain embodiments have been described, these embodiments have been presented by way of example only, and are not intended to limit the scope of the inventions. Indeed, an EBG structure, a semiconductor device, and a printed circuit board described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An EBG (Electromagnetic Band Gap) structure comprising:
    an electrode unit made of a first conductor and provided with a space;
    a patch unit provided approximately parallel to the electrode unit and made of a second conductor;
    an insulating layer provided between the electrode unit and the patch unit;
    a first via provided between the patch unit and the electrode unit in the insulating layer and connected to the patch unit and the electrode unit; and
    a second via provided between the patch unit and the space in the insulating layer, the second via having one end connected to the patch unit and another end not connected to any of conducting materials.

2. The structure according to claim 1, wherein a space-side end portion of the second via reaches the space.

3. The structure according to claim 1, wherein the electrode unit is a ground line or a power line.

4. The structure according to claim 1, wherein the first conductor is aluminum (Al) or gold (Au), and the second conductor is aluminum (Al) or gold (Au).

5. A semiconductor device comprising an EBG (Electromagnetic Band Gap) structure, the EBG structure comprising:
    an electrode unit made of a first conductor and provided with a space;
    a patch unit provided approximately parallel to the electrode unit and made of a second conductor;
    an insulating layer provided between the electrode unit and the patch unit;
    a first via provided between the patch unit and the electrode unit in the insulating layer and connected to the patch unit and the electrode unit; and
    a second via provided between the patch unit and the space in the insulating layer, the second via having one end connected to the patch unit and another end not connected to any of conducting materials.

6. The device according to claim 5, wherein a space-side end portion of the second via reaches the space.

7. The device according to claim 5, wherein the electrode unit is a ground line or a power line.

8. The device according to claim 5, wherein the first conductor is aluminum (Al) or gold (Au), and the second conductor is aluminum (Al) or gold (Au).

9. A printed circuit board comprising an EBG (Electromagnetic Band Gap) structure, the EBG structure comprising:
    an electrode unit made of a first conductor and provided with a space;
    a patch unit provided approximately parallel to the electrode unit and made of a second conductor;
    an insulating layer provided between the electrode unit and the patch unit;
    a first via provided between the patch unit and the electrode unit in the insulating layer and connected to the patch unit and the electrode unit; and
    a second via provided between the patch unit and the space in the insulating layer, the second via having one end of connected to the patch unit and another end not connected to any of conducting materials.

10. The printed circuit board according to claim 9, wherein a space-side end portion of the second via reaches the space.

11. The printed circuit board according to claim 9, wherein the electrode unit is a ground line or a power line.

12. The printed circuit board according to claim 9, wherein the first conductor is aluminum (Al) or gold (Au), and the second conductor is aluminum (Al) or gold (Au).

* * * * *